United States Patent [19]

Bowman et al.

[11] Patent Number: 5,457,956
[45] Date of Patent: Oct. 17, 1995

[54] MICROMINIATURE STIRLING CYCLE CRYOCOOLERS AND ENGINES

[75] Inventors: Lyn Bowman; David M. Berchowitz; Israel Urieli, all of Athens, Ohio

[73] Assignee: Ohio University, Athens, Ohio

[21] Appl. No.: 333,356

[22] Filed: Nov. 2, 1994

Related U.S. Application Data

[63] Continuation of Ser. No. 190,582, Feb. 2, 1994, which is a continuation of Ser. No. 17,265, Feb. 12, 1993, abandoned.

[51] Int. Cl.[6] ............................. F25B 9/00; F01B 29/10; F02G 1/04
[52] U.S. Cl. ................................. 60/520; 62/6; 29/888
[58] Field of Search ............................. 60/520, 525, 518, 60/6; 290/1 R; 29/888, 890.034, 890.035

[56] References Cited

U.S. PATENT DOCUMENTS

| | | | |
|---|---|---|---|
| 3,548,589 | 12/1970 | Cooke-Yarborough | 60/526 |
| 3,604,821 | 9/1971 | Martini | 62/6 |
| 4,350,012 | 9/1982 | Folsom et al. | 62/6 |
| 4,404,802 | 9/1983 | Beale | 60/520 |
| 4,798,054 | 1/1989 | Higham | 60/520 |
| 5,251,448 | 10/1993 | Rodger | 60/520 |

OTHER PUBLICATIONS

Silicon as a Mechanical Material, K. E. Petersen, Dec. 1982.
Microminiature refrigeration, W. A. Little, Jan. 1984.
Frequency Response Of Polycrystalline Silicon Microbridges, R. T. Howe and R. S. Muller, Dec. 1985.
Pressure Dependence Of Resonant Diaphragm Pressure Sensors, J. G. Smits, H. A. C. Tilmans and T. S. J. Lammerink, Dec. 1985.
A Piezoelectric Micropump Based On Micromachining Of Silicon, H. T. G. van Lintel, F. C. M. van de Pol & S. Bouwstra, Dec. 1989.
Study On Microengines: Miniaturizing Stirling Engines For Actuators, N. Nakajima, K. Ogawa and I. Fujimasa, Dec. 1989.

*Primary Examiner*—Henry C. Yuen
*Assistant Examiner*—M. Macy
*Attorney, Agent, or Firm*—Frank H. Foster

[57] ABSTRACT

A microminiature Stirling cycle engine or cooler is formed utilizing semiconductor, planar processing techniques. Such a Stirling cycle thermomechanical transducer has silicon end plates and an intermediate regenerator. The end plates are formed with diaphragms and backspaces, one end plate forming the expansion end and the opposite end plate forming the compression end, with the regenerator bonded in between. A control circuit apparatus is linked to the diaphragms for controlling the amplitude, phase and frequency of their deflections. The control circuit apparatus is adapted to operate the transducer above 500 Hz and the passages and the workspace, including those within the regenerator, expansion space and compression space, are sufficiently narrow to provide a characteristic Wolmersley number, which is characteristic of the irreversibilities generated by the oscillating flow of the working fluid in the workspace, below substantially 5 at the operating frequency above 500 Hz. Additionally, the amplitude of the vibrations of the diaphragm vibrations are sufficiently small to provide the working fluid a maximum Mach number below substantially 0.1 at an operating frequency above 500 Hz.

50 Claims, 10 Drawing Sheets

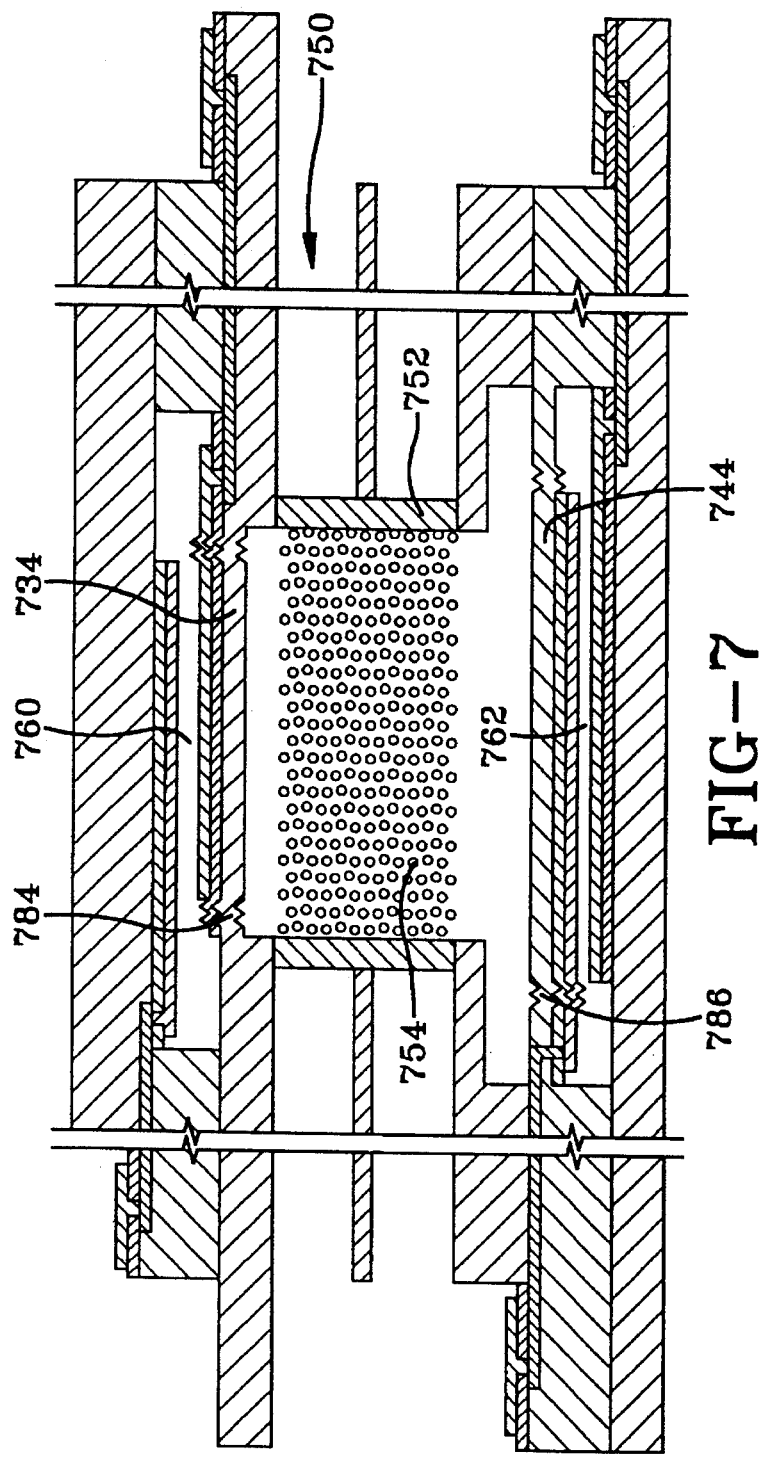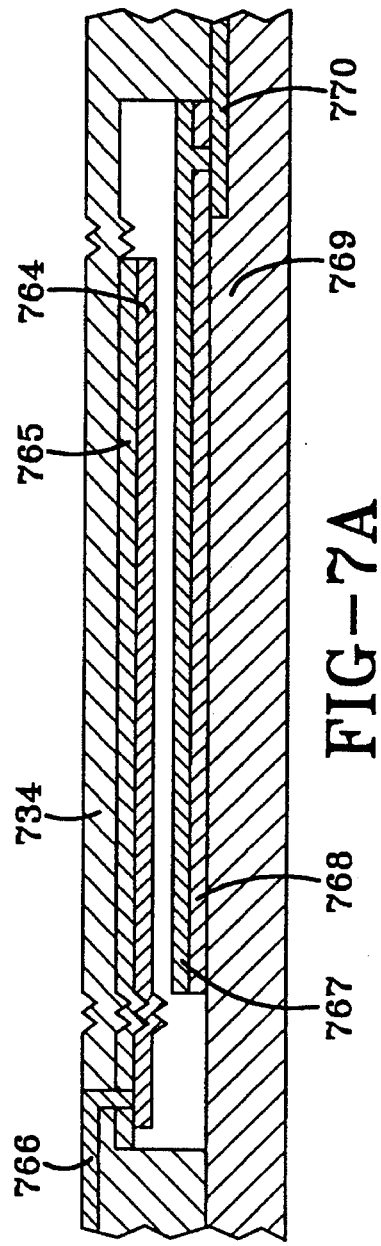
FIG-7
FIG-7A

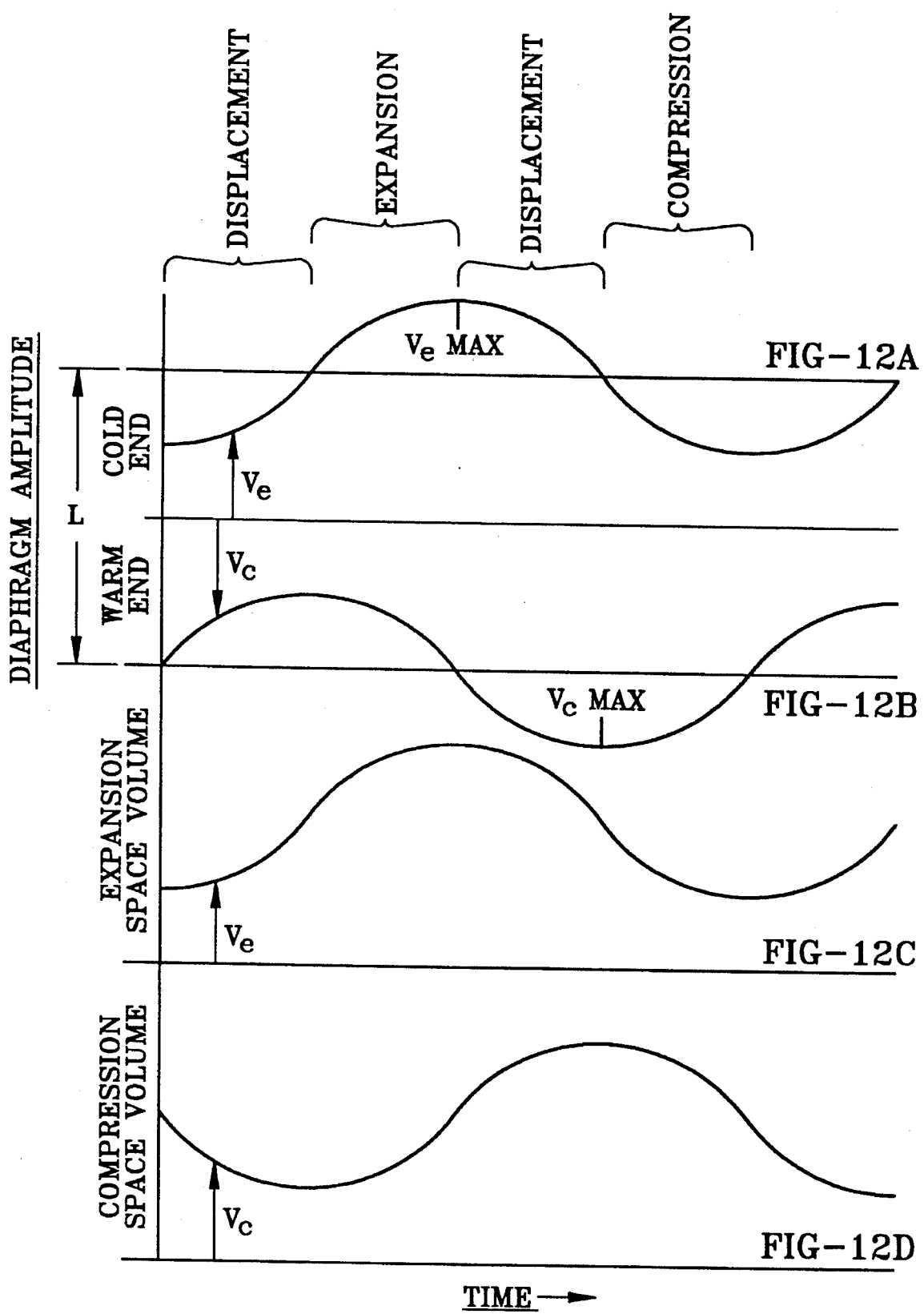

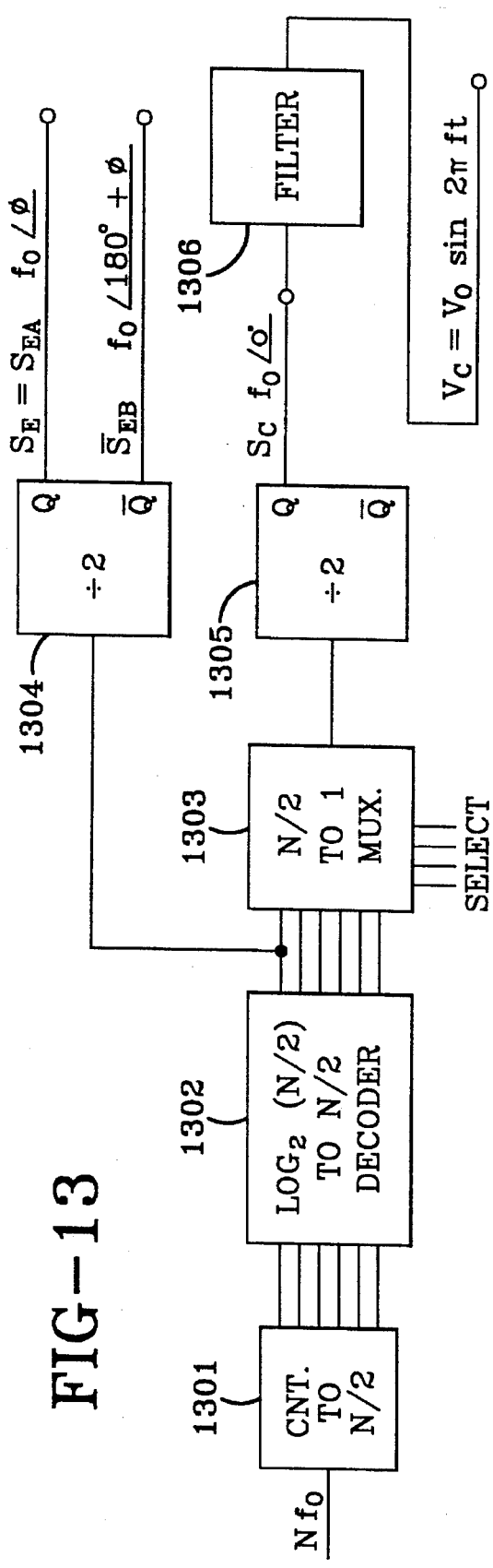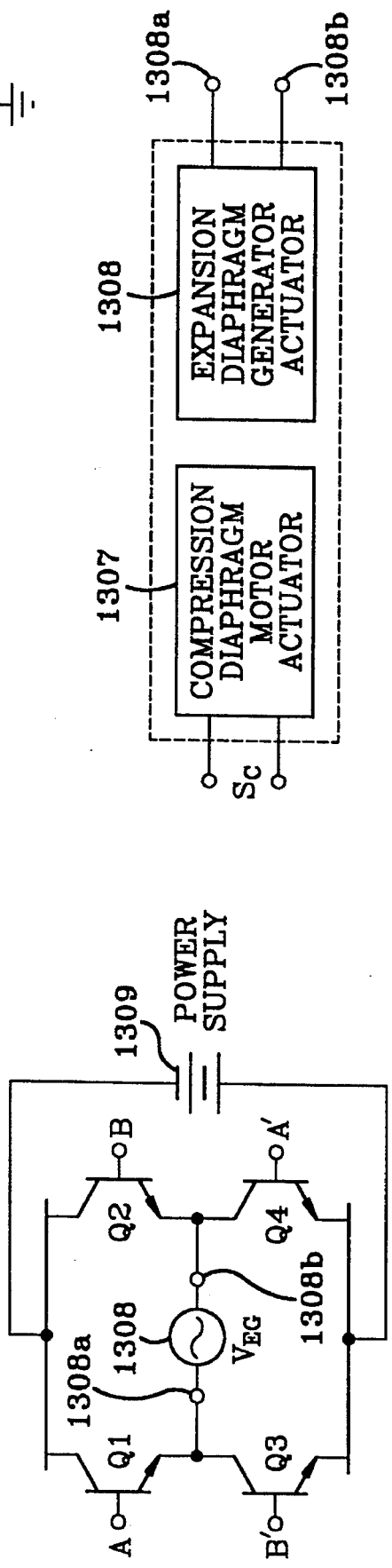

MICROMINIATURE STIRLING CYCLE CRYOCOOLERS AND ENGINES

This is a continuation of application No. 08/190,582, filed Feb. 2, 1994, which is a continuation of application No. 08/017,265, filed Feb. 12, 1993, now abandoned.

TECHNICAL FIELD

This invention relates generally to Stirling cycle engines and cryocoolers and more particularly relates to such Stirling thermomechanical transducers which are particularly useful for cooling integrated electronic circuits to cryogenic temperatures and as engines for driving micromachines.

BACKGROUND ART

Because of the advantageous electronic properties exhibited by various materials at cryogenic temperatures, various machines have been developed for cooling electronic devices so that they may be operated at cryogenic temperatures. Many such refrigeration systems have used Stirling cycle cryogenic coolers. Such existing machines, however, are relatively large, bulky, inefficient and noisy machines generating substantial vibration. While technology has developed to permit a remarkable miniaturization of electronic circuitry, thereby permitting large numbers of electronic circuits to be contained within a relatively small volume, the apparatus which is available for cooling such circuits is relatively large and consequently adds a substantial, additional volume and weight to cryogenic electronic circuitry. There is, therefore, a need for an efficient Stirling cycle cryocooler which can be miniaturized so that its size and weight are compatible with and do not add substantially to that of the electronic circuitry but are, nonetheless, capable of pumping heat at a sufficient rate to maintain the cryogenic temperatures.

A measure of the size and effectiveness of a cooler in pumping thermal energy is its specific capacity. Specific capacity is the ratio of the quantity of thermal energy which the machine can pump to a quantitative measure of its size or weight. Thus, a cryocooler must not only be able to pump sufficient thermal energy from the electronic device to maintain it at a cryogenic temperature, but should do so with the smallest possible size or weight. Consequently, the higher the specific capacity, the more desirable is the cooler.

The prior art has recognized that the specific capacity of a Stirling cycle cooler can be increased and therefore improved by operating the cooler at a higher frequency. A sufficiently high, thermal energy pumping rate can be maintained if the cooler is made smaller, but the frequency of its operation is increased so that more thermal energy pumping cycles occur each second.

However, the prior art has also recognized that entropy generating processes (i.e., irreversibilities) have imposed an upper limit on the frequency of operation of Stirling cycle machines. As the operating frequency is increased, viscous dissipation resulting from the friction of the working fluid with the internal passage walls of the Stirling cryocooler also increases. As a result, more work is required to move the gas back and forth through the passages of the Stirling cycle machine at higher frequencies. In addition, the apparent thermal conductivity of the working fluid in the regenerator increases causing a larger amount of heat to be conducted into the cold end of the machine, and heat transfer in heat exchangers is reduced. The latter effects occur as a result of certain phase relationships between the periodic variations in axial mass flow and radial temperature gradient which arise in oscillatory flow. As a result, the amount of heat that must be pumped by the cryocooler is increased while the effectiveness of the cryocooler in exchanging heat with its surroundings is reduced. Consequently, increasing the frequency reduces the heat lifted. Therefore, the prior art has come to accept an upper frequency limit for Stirling cycle machines on the order of 50 Hz and a machine constructed to operate at 120 Hz is believed to be the highest frequency Stirling machine ever built.

There is, therefore, a need for a Stirling cryocooler which can lift heat at a sufficient rate to maintain electronic devices at cryogenic temperatures, but which also has a sufficiently small size and weight that it exhibits a specific capacity which is acceptable and compatible with the equipment which utilizes these electronic circuits.

Recent years have also seen the development of a micromachine technology. While such machines utilize mechanical devices, such as motion conversion linkages, mechanical advantage mechanisms, power trains, valves, diaphragms, cantilever beams and the like, which have configurations and modes of operation like conventional mechanical devices, they have a size on the order of a few millimeters or smaller.

Although Stirling cycle engines have long been used as mechanical prime movers, there is a need for a microminiature Stirling cycle engine for use with developing micromachine technology.

BRIEF DISCLOSURE OF INVENTION

The prior art discloses Stirling cycle, thermomechanical transducers having a pressure containing vessel, including fluid passages, and containing a compressible and expansible working fluid. The prior art also discloses the use of flexible diaphragms associated with the transport of the working fluid and the volume changes which are inherent with the Stirling cycle. Such diaphragms are combined with a control circuit apparatus or means linked to the diaphragms for controlling the mode, amplitude, phase and frequency of their deflection.

The present invention utilizes the combination of a control system which is adapted to operate the Stirling cycle thermomechanical transducer above an operating frequency of 500 Hz, such as 1000 Hz for example, combined with passages in the work space which are sufficiently narrow to provide a Wolmersley number below 5 and diaphragm amplitudes sufficiently small to provide Mach numbers below 0.1 at the operating frequency. These narrow passages and small diaphragm vibration amplitudes sufficiently reduce the irreversibilities or work done in transporting the working fluid to provide a machine which has an acceptably high, specific capacity. The result is that practical, sufficiently high specific capacities can be achieved at much smaller sizes than previously possible.

The invention also contemplates forming the hot and cold ends of the Stirling cycle device of silicon and utilizing planar processing techniques, such as photo etching, silicon fusion bonding and thin film technology to allow wafer-scale manufacturing, creating hundreds of microrefrigerator components simultaneously. The invention further contemplates the construction of arrays of such transducers and their construction both as coolers and engines. Further aspects of the invention are described below or will become apparent to those skilled in the art.

BRIEF DESCRIPTION OF DRAWINGS

FIGS. 6, 7, and 7A are views similar to those of FIGS. 4, 5, and 5A, but illustrating an alternative embodiment of the invention.

FIG. 12A–12D consist of four graphs illustrating the displacement and volume variations of an embodiment of the invention.

FIGS. 13–17 are block and schematic diagrams illustrating a control system for the present invention.

Figure 1:
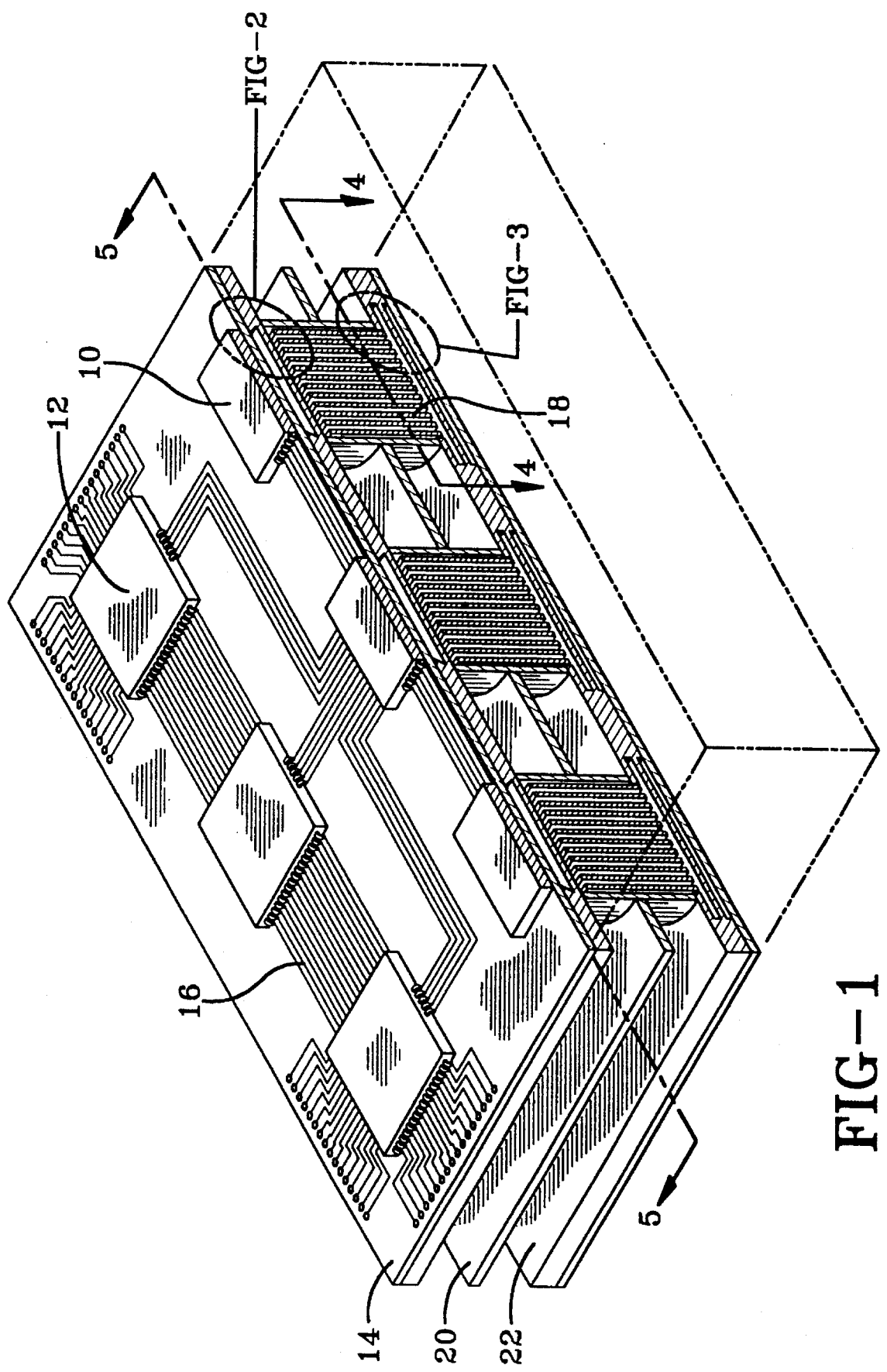
FIG. 1 is a view in perspective and in section illustrating an array of Stirling cycle transducers embodying the present invention for purposes of cooling electronic integrated circuits.
Figure 2:
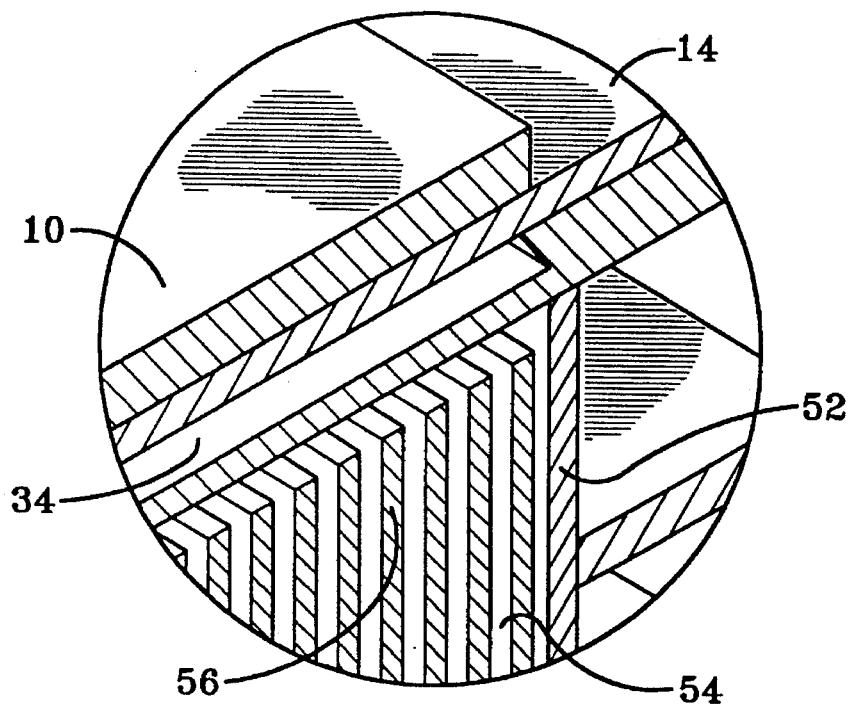
FIG. 2 is an enlarged view of a portion of FIG. 1 for illustrating detail.
Figure 3:
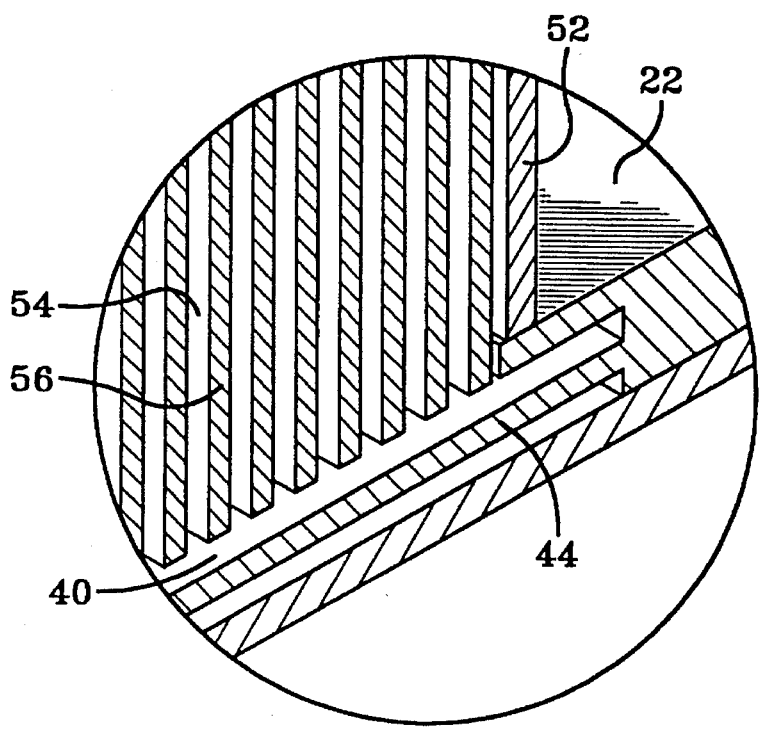
FIG. 3 is an enlarged view of another portion of FIG. 1 for illustrating detail.
Figure 4:
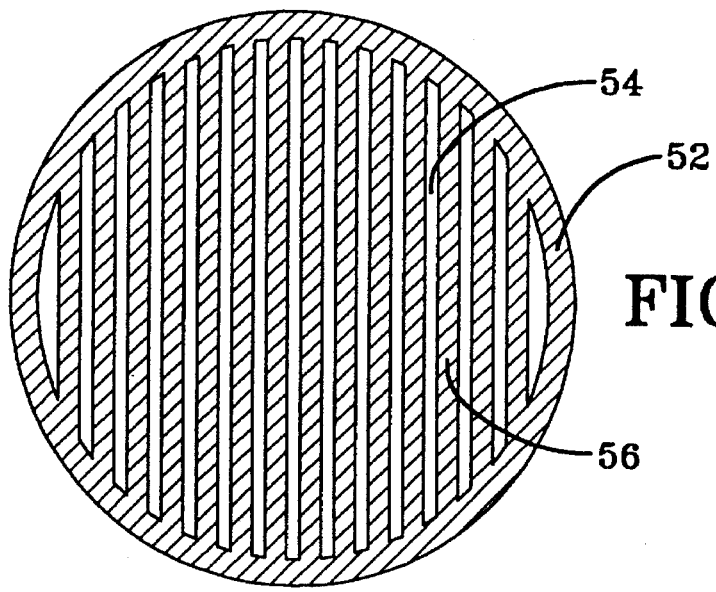
FIG. 4 is a view in horizontal section taken substantially along the lines 4—4 of FIG. 1.
Figure 6:
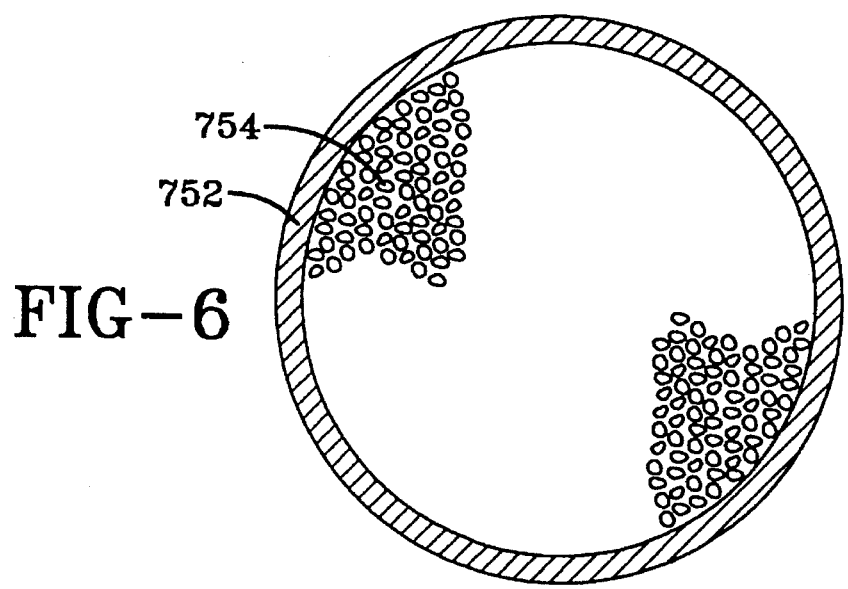

In describing the preferred embodiment of the invention which is illustrated in the drawings, specific terminology will be resorted to for the sake of clarity. However, it is not intended that the invention be limited to the specific terms so selected and it is to be understood that each specific term includes all technical equivalents which operate in a similar manner to accomplish a similar purpose.

DETAILED DESCRIPTION

While the definitions of terminology, which is used in this document to describe the preferred and alternative embodiments of the invention, are generally known to those skilled in the art, it is desirable to briefly review and expressly define a few of the terms which will be used.

A "transducer" is a device for converting useful energy in one form to useful energy to another form. For example, energy may be converted from the energy of mechanical motion to an electrical current or from thermal energy to mechanical motion energy. Additionally, it is known that many transducers which can be operated in one mode, can also be operated in a reverse mode. For example, a device may be operated both as an electrical motor to convert energy from electrical current to mechanical rotation or reciprocation or it may be operated as a generator to convert such mechanical motion to electrical current. Similarly, a Stirling transducer may be operated either to convert thermal energy, flowing from a higher temperature to a lower temperature, to mechanical motion or it may be operated to utilize mechanical motion to pump thermal energy, i.e. heat, from a lower temperature to a higher temperature. Therefore, the devices of this invention are referred to as Stirling Cycle Transducers. Thus, it should be apparent that most features and embodiments of the present invention may be used both in the engine mode, as well as in a cooling or refrigerator mode.

The term "bonded" is used in a general sense to describe separately identifiable structures or layers which are mechanically joined, regardless of how they got that way. It includes not only two objects or layers which are first separately constructed and then joined together, but also includes two structures or layers which are integrally formed, grown or deposited one in connection to the other.

FIG. 1 illustrates six electronic, integrated circuits, such as integrated circuits 10 and 12, mounted upon a silicon substrate 14 and having interconnecting, conductor buses 16 formed on the substrate 14. Constructed beneath the integrated circuits are several Stirling coolers for removing heat from the integrated circuits. Although the figure shows one Stirling cooler associated with each integrated circuit, such one-to-one association is not necessarily required or implied. Each of these Stirling cycle coolers, such as the cooler 18, is a replication of the others and together they are shown arranged in a 2 by 3 array.

Spaced beneath the uppermost, silicon substrate 14 is a central support plate 20 for supporting the centrally positioned regenerator of each Stirling cooler. Although a single support plate is indicated as centrally located along the length of the regenerator, a multiplicity of support plates might be employed and located anywhere along the length of the regenerator, including at each end of the regenerator such as end support plates 1151 and 1153 shown in FIG. 11. Beneath and parallel to the central support plate 20 is a lowermost, second silicon substrate 22.

The uppermost silicon substrate 14, the lowermost silicon substrate 22 and the interposed portions of each Stirling cycle cooler form the pressure containing vessel of the Stirling cycle coolers. Each pressure containing vessel defines an enclosed workspace, including fluid passages, and contains a compressible and expansible fluid, typically a gas, all of which are needed for forming a Stirling cycle, thermomechanical transducer. In particular, the upper substrate 14 forms a heat accepting, fluid expansion end plate and the lower silicon substrate 22 forms a heat ejecting, fluid compression end plate for each Stirling cycle cooler. Interposed between these end plates is the heat regenerator which includes a perforate matrix in fluid communication with the end plates at its opposite ends.

These structures for one embodiment are illustrated in greater detail in FIGS. 2, 3, 4, and 5 and are described with reference to those figures. The end plates 14 and 22 may each comprise multiple, laminated layers. The structures of the end plates 14 and 22 are preferably formed utilizing planar processing technology of the type utilized in manufacturing electronic integrated circuits and silicon sensors and actuators.

The heat accepting, fluid expansion end plate 14 defines an expansion space 30, a back space 32 distal to the expansion space 30, and a flexible, expansion diaphragm 34 between the expansion space 30 and the backspace 32. A heat accepting, heat exchanger, proximately bounds the expansion space 30. In the preferred embodiment, the heat accepting heat exchanger is the heat accepting end plate 14, which bounds the work space along interior wall 36 and includes the diaphragm 34, although alternatives may be used as described below.

Similarly, the heat ejecting, fluid compression end plate 22 defines a compression space 40, a backspace 42 distal to the compression space 40, and a flexible, compression diaphragm 44 forming a wall between the compression space 40 and the backspace 42. A heat ejecting heat exchanger is formed by the end plate 22 which proximally bounds the compression space 40 along the interior wall 46.

In order to control the frequency, phase and amplitude of the diaphragms, each is provided with an actuator which is a part of a control system. The expansion diaphragm 34 has an associated actuator 35 and the compression diaphragm 44 has an associated actuator 45. The actuators may, for example, include piezoelectric materials, which are electrically connected to the remainder of the control system. Actuators are subsequently discussed in more detail below.

Interposed between the heat accepting end plate 14 and the heat ejecting end plate 22 is a heat regenerator 50, supported in place by the central support plate 20. The heat regenerator 50 has a surrounding, typically cylindrical, gas impervious wall 52 which contains the working gas and is sealingly connected to the end plate 14 and the end plate 22. Supported within the surrounding wall 52 is a perforate matrix 54 in fluid communication with both the expansion space 30 and the compression space 40. The perforate matrix illustrated in FIG. 4 comprises a plurality of spaced, planar walls 56 connected at their opposite sides to the surrounding wall 52. Preferably the passages between these walls have a cross-sectional aspect ratio greater than approximately 8.

The perforate matrix which forms the regenerator may have a variety of configurations. It is a structure with passages which communicate axially through the regenerator from the expansion space 30 to the compression space 40. The regenerator must be capable of transporting the gas axially and cyclically storing and releasing heat periodically so that the heat is pumped axially through the regenerator in increments for each cycle. The passages may be formed in a regular pattern between layers of material or may be a series of homogeneously distributed, interconnected pores in a foam-like material. Various alternative embodiments of such regenerator structures are subsequently described.

It is desirable that the regenerator exhibit a very high internal surface area to maximize the gas/regenerator interfacing surface and have a high thermal capacity for the storage of heat. It is also desirable to minimize the thermal conductivity through the regenerator material along the axial direction between the end plate 14 and the end plate 22. In a cooler, any heat conducted through the regenerator material represents heat conducted back into the end being cooled and in an engine represents shunted heat which provides no mechanical work output. Consequently, a low thermal conductivity material, such as ceramic or glass, is preferred, as well as a structure having a low geometrical, cross-section of mass.

It is a critically important feature of the present invention that the diameter or other corresponding lateral dimensions of the passageways through the perforate matrix of the regenerator be very small. It must be sufficiently small to provide a Wolmersley number below 5 at the operating frequency of the Stirling thermomechanical transducer in order to minimize the irreversibility losses associated with transporting the gas through those passages. Another critically important feature in order to minimize the irreversibility losses associated with transporting the working fluid through the aforesaid passages in the present invention is that the amplitude of diaphragm vibrations be very small. It must be sufficiently small to provide a maximum Mach number substantially below 0.1 at the operating frequency of the Stirling thermomechanical transducer.

These irreversibilities are a source of parasitic losses arising from a generation of heat by friction between the working gas and the passage walls. It results in viscous dissipation, from increased heat conduction by the working gas through the regenerator, and from reduced heat transfer in heat exchangers as the working frequency increases, the latter two phenomena being peculiar to oscillatory flow as a result of certain phase relationships between the periodic variations in axial mass flow and the radial temperature gradient. In the present invention the lateral dimensions of these flow passages are on the order of 10–50 microns and the amplitudes of diaphragm vibrations are on the order of 10–100 microns in order to compensate for the increase in frequency. The use of such small passages and vibration amplitudes reduces these parasitic losses. The reductions in these losses correspondingly increase the useful work which may be performed by the Stirling cycle, thermomechanical transducer in lifting heat or providing mechanical work.

A quantitative indication of the irreversibilities associated with oscillatory fluid flow in a passageway is given by the Wolmersley number. It is expressed by the equation:

$$\alpha = (2\pi f \cdot a^2 \rho / \eta)^{1/2} \qquad \text{I.}$$

wherein:
 $\alpha$=Wolmersley Number
 f=operating frequency
 a=passageway diameter
 $\rho$=working fluid density (which is a function of temperature and pressure)
 $\eta$=working fluid dynamic viscosity (a function of temperature)

Another quantitative indication of irreversibilities associated with fluid flow in a passageway is given by the Mach number. It is expressed by the equation:

$$Ma = 2\pi f \cdot x_g / C_o \qquad \text{II.}$$

wherein:
 Ma=Mach number
 $x_g$=the amplitude of oscillating axial gas displacement
 $c_0$=the velocity of sound in the working fluid The axial oscillating working fluid displacement is related to the amplitude of diaphragm vibration by the equation:

$$x_g = x_d \cdot A_d / A_x \qquad \text{III.}$$

wherein:
 $x_d$=the amplitude of diaphragm vibration
 $A_d$=the area of the diaphragm vibration
 $A_x$=the total cross-sectional area of all the passageways through which the working fluid flows The velocity of sound in the working fluid is well known $$C_o = (\gamma RT)^{1/2} \qquad \text{IV.}$$

wherein:
 $\gamma$=the ratio of specific heats at constant pressure and constant volume
  =5/3 for helium
 R=the specific gas constant for the working fluid
  =2079 joules/kilograme.kelvin for helium
 T=absolute temperature in kelvin Equations II, III, and IV can be combined to give:

$$Ma = (2\pi f \cdot x_d \cdot A_x / A_d) / (\gamma RT)^{1/2} \qquad \text{V.}$$

In order to obtain the advantages of the present invention for operating the Stirling cycle transducer above 500 Hz, the passages must be made sufficiently narrow to provide a Wolmersley number less than 5 and the amplitude of diaphragm vibrations must be sufficiently small to provide a maximum Mach number substantially less than 0.1 at the operating frequency. Preferably the Wolmersley number is made less than 1 and the maximum Mach number is made less than 0.01.

An example illustrating the parameters of a Stirling cycle transducer embodying the present invention illustrates the application of these principles of the present invention. The example is directed to the use of a perforate heat exchanger of the type illustrated in FIGS. 8 and 9 and described below.

The following example is for such a three-part microrefrigerator, charged with helium to 20 bars and operating at 1 kHz. Because there is a temperature gradient axially through the Stirling cycle cooler embodying the present invention, the temperature, and therefore the other parameters, are different at different axial positions. The following tables show one illustrative set of parameters wherein the well known Reynolds number is related to the previously defined quantities by:

$$Re = \alpha^2 X_g / a \qquad \text{VI.}$$

the expansion space volume $V_e$ and compression space volume $V_c$ with respect to time. As illustrated in these figures, the control system must control the diaphragms so that the expansion space volume leads the compression space volume by a nominal or approximate 90°. However, the phase lead is not necessarily exactly 90, as known to those skilled in the art, and may vary, for example, by as much as 10° or 20° for optimizing efficiency. For engines and coolers, the preferred volume phase leads are greater than 90°. This approximate 90° phase lead must be maintained for both coolers and engines.

In order to maintain the proper phase, amplitude and frequency for the periodic motion of the diaphragms, the control system includes an actuator, such as the actuators 35 and 45 referred to above. Preferably each actuator is an electro-mechanical transducer, mechanically linked to its associated diaphragm. Suitable transducers include magnetic transducers, such as taught by the above Cooke-Yarborough patent, piezoelectric transducers, magnetostrictive transducers, capacitive transducers or other transducers which can drive the diaphragms. Electromechanical trans-

TABLE 1

| Location | Temp. (°K.) | $x_g$ (μm) | a (μm) | ρ (kg/m³) | η (× 10⁻⁶Pa·s) | Re | α |
|---|---|---|---|---|---|---|---|
| Cold Heat Exchanger | 100 | 200 | 10 | 9.8 | 9.5 | 13 | 0.81 |
| Mid-Regenerator | 225 | 300 | 20 | 4.3 | 16.2 | 10 | 0.82 |
| Warm Heat Exchanger | 350 | 600 | 30 | 2.8 | 21.8 | 9.7 | 0.85 |

TABLE 2

| Location | Temp. (°K.) | $x_d$ (μm) | $A_d$ (× 10⁻⁶m³) | $A_x$ (× 10⁻⁶m³) | Ma |
|---|---|---|---|---|---|
| Cold Heat Exchanger | 100 | 100 | 64 | 32 | 0.002 |
| Mid-Regenerator | 225 | 100* | 180* | 32 | 0.004 |
| Warm Heat Exchanger | 350 | 100 | 290 | 32 | 0.005 |

*In the regenerator, averages of the two diaphragm displacements and areas are used, because the gas displacement is influenced by both diaphragms.

[CONTROL SYSTEM]

The theory of operation and various embodiments for controlling the phase and frequency of the expansion diaphragm 34 and the compression diaphragm 44 are taught by the prior art and therefore are not described in detail. Such operation is described, for example, in the Cooke-Yarborough patent, 3,548,589. As the diaphragms vibrate they move alternately into and away from their respective, associated expansion and compression spaces, thereby periodically varying the effective volume of these spaces, alternately transporting gas into and out of the respective expansion and compression spaces.

FIG. 12, graphs 12A and 12B, illustrate the loci of the diaphragm displacement with respect to time at the opposite ends of the regenerator. Because these diaphragms face one another at opposite ends, a motion in opposite directions (for example, toward the center) has the same effect in changing the volume of their associated spaces. Thus, volume changes with respect to time for the expansion and compression spaces appear in FIGS. 12A and 12B as volumes $V_e$ and $V_c$. FIGS. 12C and 12D are provided to illustrate the changes in ducers are preferred because of the ease of making connections to them and the ease of controlling the phase, amplitude and frequency of electrical drive signals.

As known to those skilled in the art of diaphragm implemented, Stirling cycle thermal transducers, one of the diaphragms is actually driven by the working gas pressure variations, while the other is driven by energy applied to its associated transducer. In a cooler the expansion end diaphragm is driven by the gas pressure variations and in an engine the compression end diaphragm is driven by the gas pressure variations. However, actuators are still required for each diaphragm because energy must be dissipated from the diaphragms which are driven by gas pressure variations and the amplitude frequency and phase of each diaphragm must be controlled. The term "actuators" is therefore used in a broad sense to include devices which can absorb or apply mechanical energy to or from the diaphragm and is not limited to those which only give mechanical work output. Therefore, it is the purpose of the control system, including the actuators, to cause the diaphragms to vibrate with the desired phase relation, amplitude and frequency.

Figure 16:
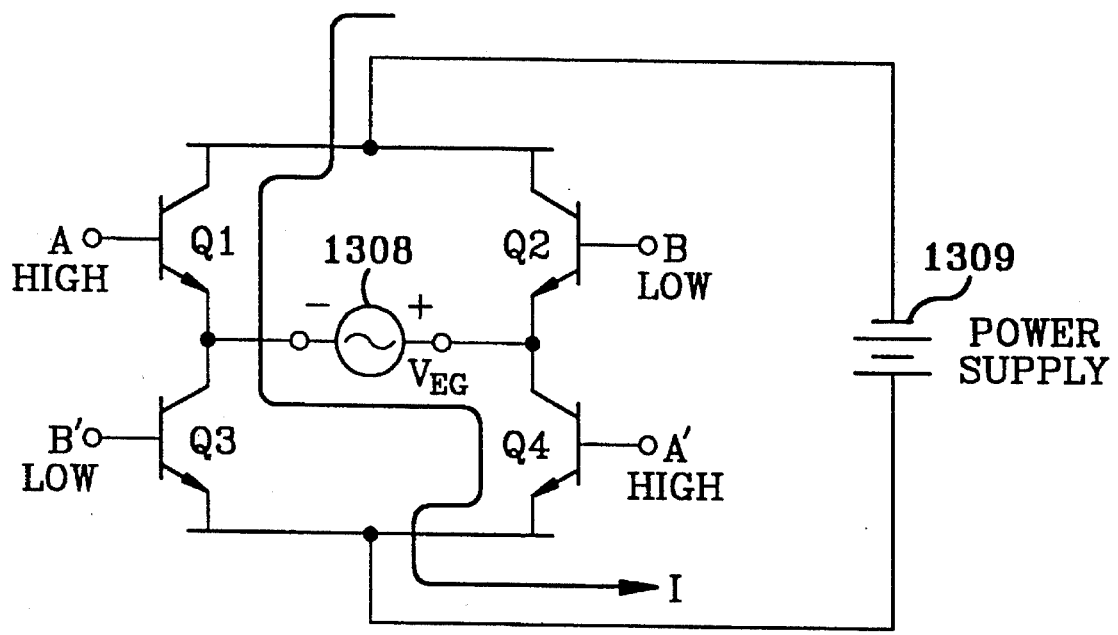
Figure 17:
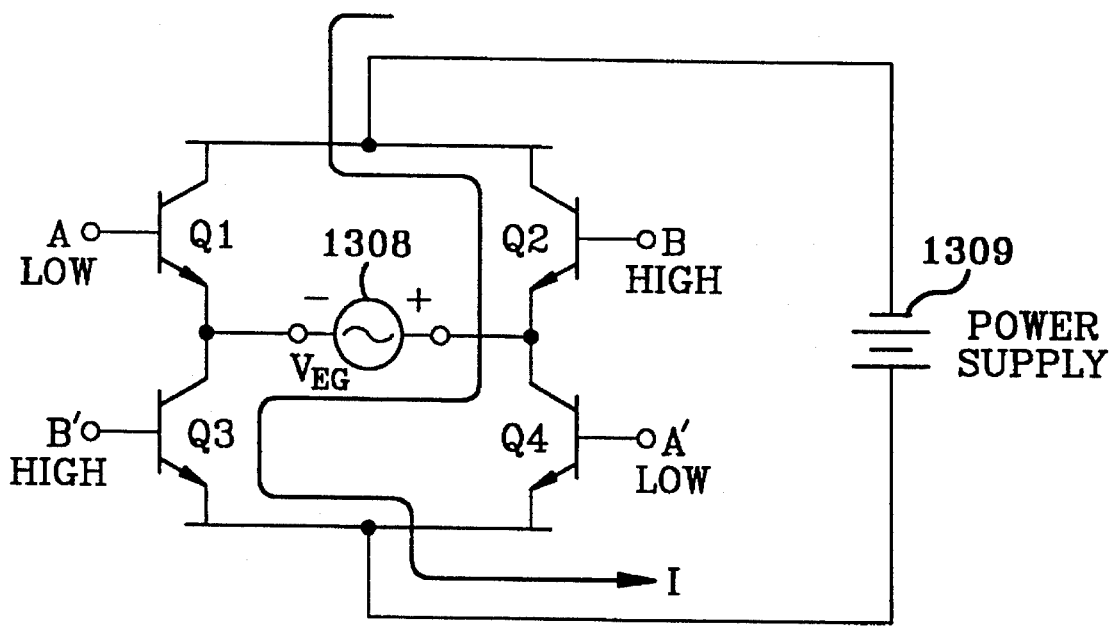

A representative control system for maintaining the desired phase, amplitude and frequency of diaphragm vibrations is illustrated in FIG. 13. Digital pulse train control signals $S_c$, $S_{EA}$ and $S_{EB}$ at the resonant frequency $f_0$ of the microrefrigerator are derived by means of a digital counter 1301, decoder 1302, multiplexer 1303, and dividers 1304 and 1305 from a single digital pulse train at a multiple of the resonant frequency $Nf_0$. The phase lead of $S_{EA}$ with respect to $S_c$ is chosen by the Select inputs of the multiplexer 1303 to an arbitrary precision determined by the width of the data path of digital counter 1301, decoder 1302, and multiplexer 1303. The fundamental sinusoidal component $S_{co}$ of control signal $S_c$ is extracted by the filter 1306 and applied to the compression diaphragm motor-actuator 1307 shown in FIG. 15. Control signal $S_{EA}$ and its inverse $S_{EB}$ are applied to the control terminals A and A' and B and B', respectively, of a H-bridge of transistors Q1–Q4 shown in FIG. 14. Excitation of this H-bridge by control signals $S_{EA}$ and $S_{EB}$ actively rectifies the alternating voltage $V_{EG}$ generated by expansion diaphragm generator-actuator 1308 and appearing at its terminals 1308a and 1308b for charging the DC power supply 1309 that back-biases the H-bridge. FIGS. 16 and 17 illustrate the directions of electrical current flow generated by the expansion diaphragm generator-actuator 1308 through the H-bridge during alternate phases of the control signals $S_{EA}$ and $S_{EB}$. By this arrangement, electrical power flows from power supply 1309 into the compression diaphragm motor-actuator 1307 and out of the expansion diaphragm generator-actuator 1308 into power supply 1309. The difference between the amount of electrical power that flows out of and into power supply 1309 is the net power consumption of the microrefrigerator. Transistors Q1–Q4 are illustrated as bipolar transistors, but minor circuit modifications would permit the same function to be performed by MOS or JFET transistors.

[Integral End Plate Alternatives.]

The use of silicon for forming the end plates 14 and 22 affords unique and major opportunities for the construction of a Stirling cycle, thermomechanical transducer. Because one important function of the end plates is to conduct heat, silicon provides advantageous results because it exhibits a high, thermal conductivity. Secondly, the choice of silicon permits the end components of the Stirling cycle transducer to be formed utilizing prior art silicon planar processing techniques which have been used in the past for forming integrated, electronic circuits and silicon transducers. Thirdly, the use of silicon permits such integrated electronic circuits to be joined to the expansion end plate 14 with high reliability, despite the thermal cycling of the structure, because thermomechanical stress between the integrated circuits and the cold plate is eliminated due to their identical thermal coefficients of expansion. Fourthly, the use of silicon permits the electronic circuits to be formed integrally with or within the expansion end plate 14 to maximize the thermal conductivity for pumping heat away from the electronic circuitry.

Figure 5:
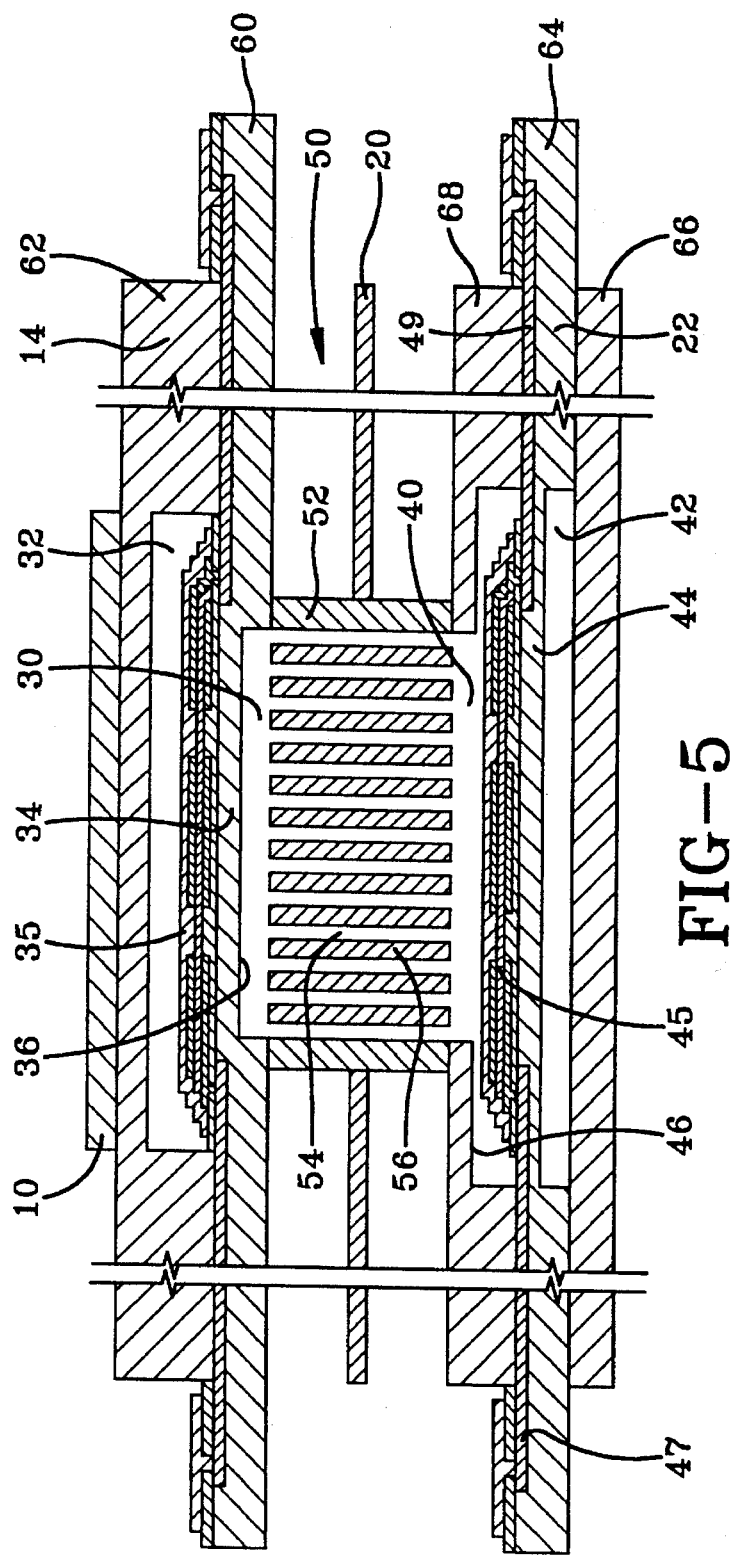
FIG. 5 is a view in vertical section taken along the line 5—5 of FIG. 1.

For example, and referring to FIG. 5, the end plate 14 may comprise two silicon layers, an interior layer 60 and a cover layer 62. The diaphragm 34 is formed by conventional, planar processing etching to form the expansion space 30, and leaving the diaphragm 34. Backspace 32 is enclosed by bonding the cover layer 62 to the interior layer 60 so that the two silicon wafers are joined together in the plane by prior art techniques, such as silicon fusion bonding or the use of an intermediary film of glass or metal or an anodic bond. Similar or related techniques are also used for forming the backspace 42 and the workspace 40 in the compression end plate 22, which consists of interior layer 64 and cover layer 66 and 68.

The areas of the expansion and compression diaphragms may be either identical or different as indicated in FIG. 5.

[Heat Exchanger Alternatives.]

In embodiments of the invention heat is conducted through the expansion end plate 14 and transferred into the expansion space 30 and is also transferred from the compression space 40 into and then conducted through the compression end plate 22. As stated above, the interior surface walls of the portion of the work space at and within these end plates may serve as heat exchangers for transferring heat between working gas in the respective expansion and compression spaces and their associated end plates.

Figure 9:
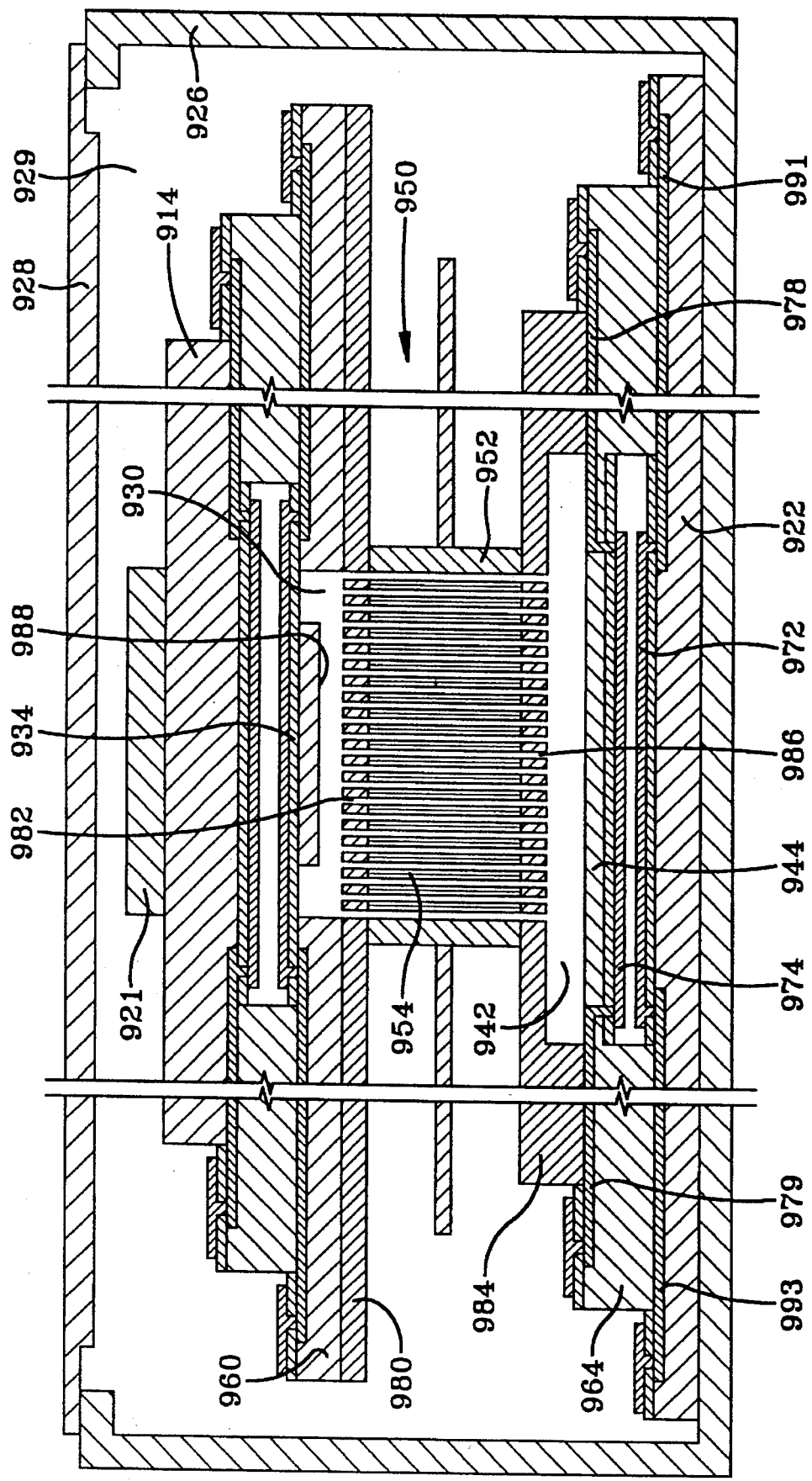
Figure 10:
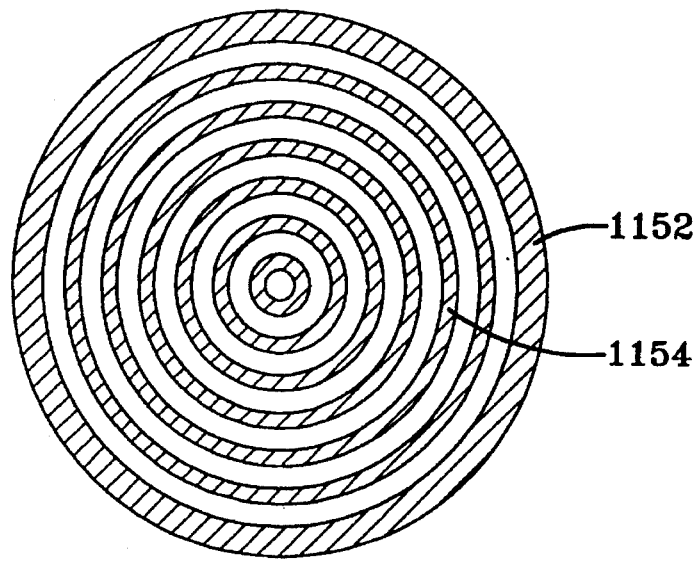
FIGS. 10 and 11 are views similar to those of FIGS. and 5, but illustrating alternative embodiments of the invention.

FIG. 9, however, illustrates an alternative structure with a separate heat exchanger structure. The embodiment of FIG. 9 has an expansion end plate 914 and a compression end plate 922. It also has an expansion diaphragm 934 and compression diaphragm 944, similar to the corresponding parts in FIG. 5. However, a separate, silicon heat exchanger layer 980 is bonded to the silicon layer 960 and is interposed between this silicon layer 960 and the regenerator 950. This heat exchanger layer 980 is provided with a plurality of axial perforations 982 communicating the expansion space 930 with the interior of the regenerator 950. Preferably these perforations are in the form of long slots separated by a series of parallel fins. A similar heat exchanger layer 984 is bonded to the compression end plate layer 964 communicating the interior of the regenerator 950 with the compression space 942. It is also provided with a plurality of transverse perforations 986.

[Diaphragm Alternatives]

Planar processing techniques also permit the silicon diaphragm to be formed in configurations other than the flat sheet configuration, which is illustrated in FIG. 5. FIG. 7, for example, illustrates an expansion diaphragm 734 and compression diaphragm 744, having annular corrugations. The expansion diaphragm 734 has annular corrugations 784 and the compression diaphragm 744 has annular corrugations 786. The corrugations may be formed by etching notches into the diaphragm. These corrugations make the diaphragm's pressure vs. displacement characteristic more nearly linear as is known in the art of constructing the diaphragms used in low pressure sensors, such as barometers.

FIG. 9 illustrates that a boss region of increased mass, such as circular boss 988, may be formed on the diaphragm 934 by planar processing techniques in order for the designer to control the mass of the vibrating diaphragm 934. This will assist the designer in constructing the vibrating diaphragm so that it will vibrate in a resonant mode.

The ratio of diaphragm displacement to the force applied to the diaphragm can be increased by forming the diaphragm so that it is resonant at the operating frequency. As is well known from elementary physics, the natural frequency of oscillation of a mechanical system is a well known function of the oscillating mass and the spring constant of an attached energy storing device, such as a spring, which alternately absorbs and releases energy. The mass of a diaphragm in the embodiment of the invention as well as the resultant spring constant of all springs acting upon the diaphragm can be selected and designed to make the diaphragm resonant at the operating frequency. The mass can be selected by the dimensions of the diaphragm and may be increased by providing a boss, as described above. The springs acting upon the diaphragm are principally the spring resulting from the elasticity of the silicon diaphragm itself, the gas spring resulting from the gas confined in the backspace, and the gas spring resulting from the gas confined in the work space, which gas springs are adjacent to each diaphragm. Consequently, the gas spring, and particularly the backspace volume, may be designed so that the diaphragm has a natural frequency of oscillation, i.e. resonance, at the operating frequency. Alternatively, of course, the backspace volume may be so large that it has a negligible spring constant and, as a consequence, the resonant frequency will principally be a function of the spring constants of the work space gas springs and of the silicon diaphragm itself and its mass. If the elasticity of the silicon is used as the principal spring constant, the backspace 10 can entirely be eliminated, such as by venting it to the backspace of an adjacent microrefrigerator unit in which the diaphragms are vibrating out of phase by 180°.

The spring constant of the diaphragm can be reduced by making the diaphragm very thin. The spring constant of the diaphragm can also be manipulated by the designer by forming layers of oxide or metal on it or diffusing other materials into it, and, as a consequence, multi-layer diaphragms may also be utilized.

[Diaphragm Actuators]

An electromechanical actuator, forming a part of the control system, is mechanically connected to each of the diaphragms. A broad variety of electromechanical actuators which may be used with the present invention will be apparent to those skilled in the art and may utilize, for example, electrostatic, electromagnetic, piezoelectric or magnetostrictive principles.

FIG. 5 illustrates a piezoelectric actuator 45 which is operated by an electrical signal applied to its conductive leads 47 and 49.

Figure 5A:
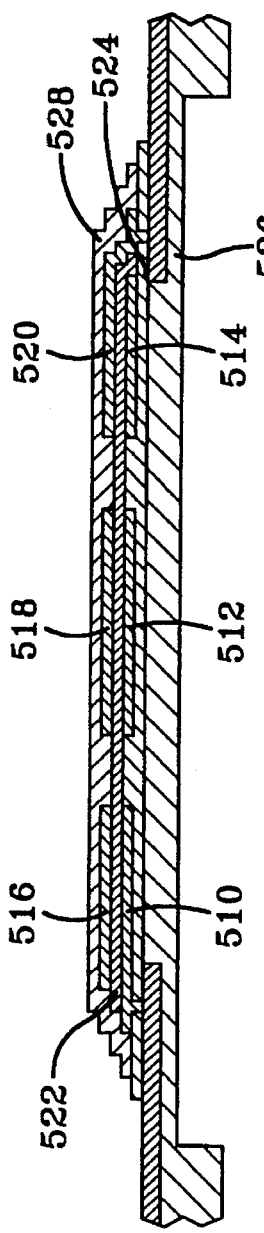
FIG. 5A is an enlarged view in vertical section of a portion of the structure illustrated in FIG. 5.

FIG. 5A illustrates this actuator in more detail. It comprises a single or a multiplicity of metal or conducting film electrodes 510, 512 and 514, which are electrically connected together and connected to the conducting lead 49, and another single or a spaced multiplicity of metal or conducting film electrodes 516, 518 and 520, which are on the opposite side of a piezoelectric layer 522, such as zinc oxide, and are interconnected together to conductive lead 47. This transducer may be fabricated by forming an insulating oxide layer 524 upon the silicon diaphragm 526, then forming the metal or conducting film strips 510, 512 and 514 by conventional techniques, then depositing a zinc oxide or other piezoelectric layer 522 upon the metal or conducting film strips and the oxide layer 524, then again using conventional techniques to deposit the metal or conducting film strips 516, 518 and 520 upon the piezoelectric layer 522. If desired, a further insulating layer of oxide 528 may be deposited on top to provide a protective barrier and electrical insulation.

In operation, the control system applies a periodic signal, at the frequency of operation, to the leads 47 and 49, thereby inducing a stress in the piezoelectric layer 522 and causing a resulting strain of the piezoelectric layer 522 and with it the motion of the diaphragm 526.

FIGS. 7 and 7A illustrate an actuator which utilizes electrostatic forces by forming capacitors 760 and 762 respectively in association with each of the diaphragms 734 and 744.

FIG. 7A illustrates the capacitor 762 in more detail. It has a capacitor plate 764 fabricated upon an oxide layer 765, which is deposited upon the diaphragm 734 and connected to an electrical conducting lead 766, shown in FIG. 7A. It also has a second capacitor plate 767, similarly fabricated upon an insulating oxide layer 768, deposited upon the end plate 769 and electrically connected to an electrically conducting lead 770.

The application of a periodic electrical control signal, which alternately charges the capacitor plates 764 and 767 with like charges and opposite charges at the frequency of operation causes periodic forces of attraction for driving the diaphragm 734 in mechanical vibration.

FIG. 9 illustrates yet another alternative actuator for driving the diaphragm 944. It comprises a pair of thin film coils 972 and 974 which are formed as planar, conductive spirals respectively upon the end plate 922 and the diaphragm 944. The planar coil 974 is connected to electrically conducting leads 978 and 979 and the planar coil 972 is connected to electrically conducting leads 991 and 993 for conduction of electrical control currents. While one electrical current may be DC, the other (or each if the first is not DC) is a periodic current at the frequency of operation to provide a time varying magnetic field, alternately attracting and repelling the diaphragm toward and away from the stationary coil 972 to apply the mechanical stress to the diaphragm, causing it to vibrate at the appropriate phase and at the frequency of operation.

[Regenerator Alternatives]

FIG. 7 illustrates a regenerator 750 having a reticulated foam 754 contained within the outer circular, pressure containing vessel wall 752. The reticulated foam 754 has continuously connected, open cell voids or cavities along the entire length of the regenerator, through which the working fluid flows. Such a regenerator may be constructed using techniques currently used in the field of ceramic filters.

Figure 8:
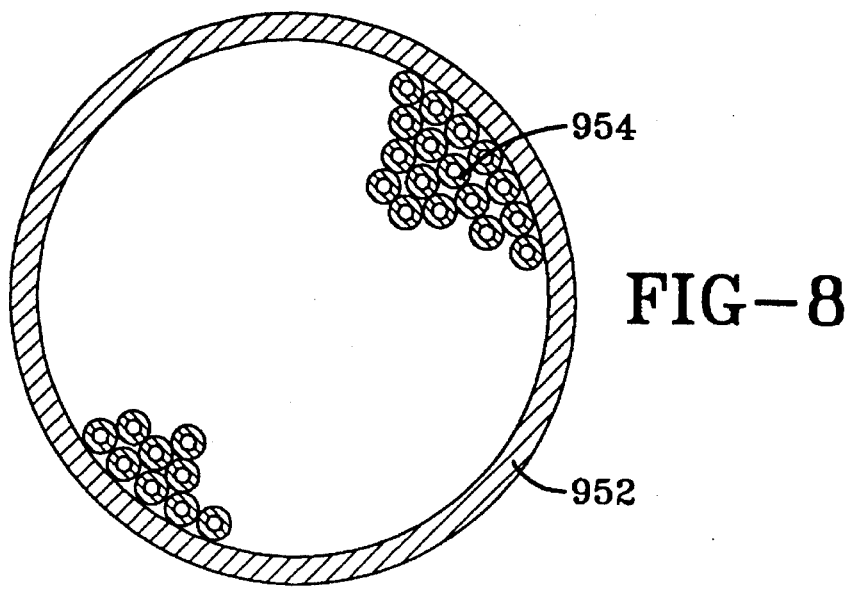
FIGS. 8 and 9 are views similar to those of FIGS. 4 and 5, but illustrating alternative embodiments of the invention.

FIG. 8 and 9 illustrates an alternative regenerator formed by a plurality of parallel tubes 954, contained within the outer, circular, pressure containing vessel wall 952. The regenerator passages consist of both the passages through the center of each tube, as well as the passages between the tubes.

Figure 11:
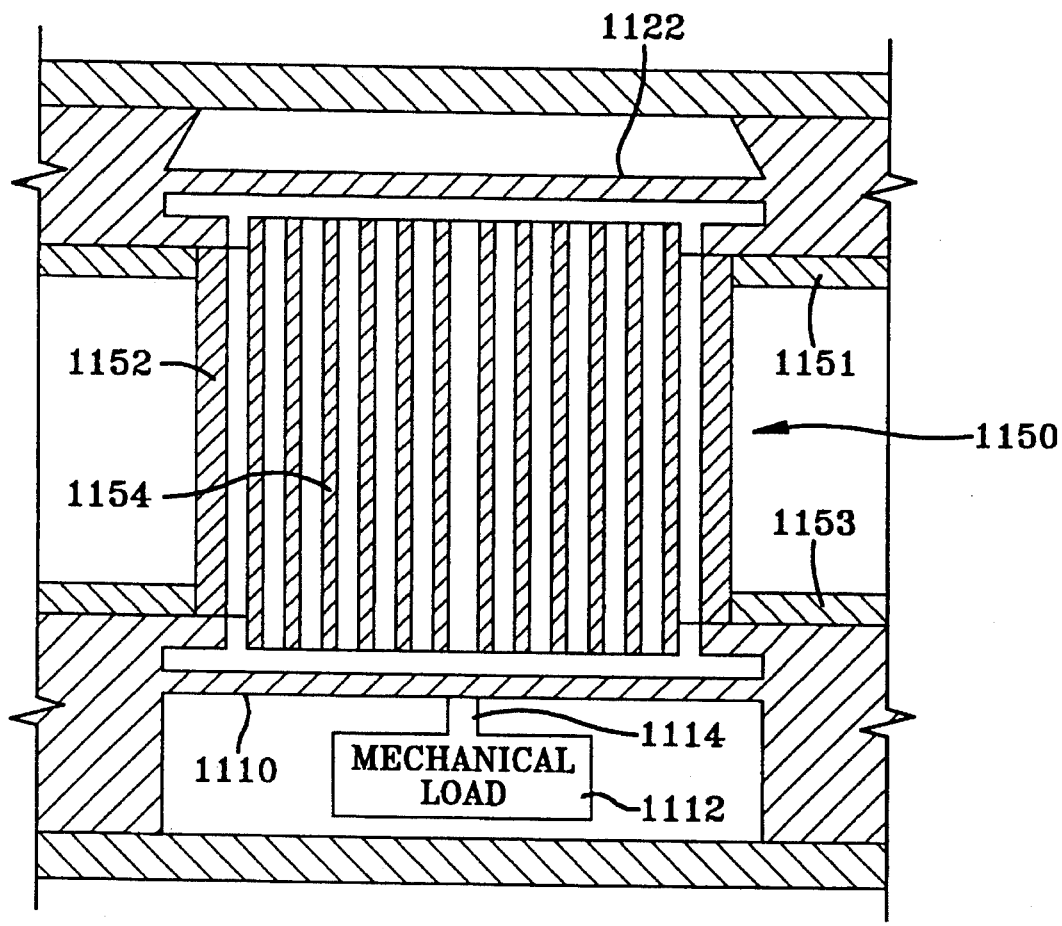

FIG. 11 illustrates yet another alternative regenerator 1150 which comprises a plurality of spaced, concentric tubes 1154 contained within and coaxial with the surrounding circular, pressure vessel wall 1152.

A regenerator may also be formed as a spirally wound, low thermal conductivity, solid film, such as a 3 mil thick glass foil, having projections deformed in the film so that when it is spirally rolled up and wound upon itself, the layers are spaced from each other to provide axial passages.

[Electronic Circuit Alternatives]

From the above description of the invention it can be seen that one of the major advantages of the present invention is that because a Stirling cycle cooler embodying the present invention may be fabricated using planar processing, thin film and other techniques which are commonly utilized in connection with the fabrication of integrated, electronic semi-conductor circuits, coolers embodying the present invention can very conveniently be fabricated so that they are physically and thermally intimately associated with the electronic circuits. The coolers may be fabricated as a part of or an extension of the fabrication of the electronic circuits. Further, these techniques allow hundreds of microrefrigerators to be manufactured simultaneously and in close association with hundreds of electronic integrated circuits. Each electronic circuit is easily and conveniently fabricated so that it is closely, thermally linked to the expansion end plate in order to efficiently pump heat from the electronic device so that the electronic device can be operated at a low, cryogenic temperature. The electronic devices may be integrally fabricated directly into the expansion end plate or in films, discrete components or integrated circuits attached to and thermally linked to the expansion end Furthermore, a refrigerator compartment, such as illustrated in FIG. 9, may be constructed in association with the end plate 914 by attaching a surrounding wall 926 for containing an electronic circuit 921 or other object to be cooled, and provided with a removable closure 928. This provides an evacuated compartment 929, the contents of which are thermally insulated from the environment, except via the compression end plate 922, for containing and cooling an object, such as electronic circuit 921. The term refrigerator is used to designate operation as a thermal energy pump, pumping heat energy from a lower temperature at the expansion end, to a higher temperature at the compression end. The term refrigerator is not confined to application to a cooled compartment.

[Engine Implementations]

Stirling cycle thermomechanical transducers embodying the present invention can also be designed and operated as an engine to provide mechanical energy to a mechanical load. To accomplish this, a thermal energy source is thermally linked to the expansion end and the control system includes an energy conveying link from the compression end diaphragm to a load. The load must be a part of the control system because the complex load impedance is part of the dynamic system determining the magnitude, phase and frequency of diaphragm vibrations described above.

FIG. 11 illustrates a compression end diaphragm 1110, connected to a mechanical load 1112 through a connecting rod 1114, operating as an energy conveying link. The load 1112 may be, for example, an electrical generator, duplex microrefrigerator or a fluid pump.

The coils in FIG. 9 may be utilized in an embodiment of the invention operated as an engine for the purpose of generating electrical power.

Thermal energy may be applied to expansion end plate 1116 in any of the conventional manners by which thermal energy is applied to Stirling cycle engines including incident solar radiation, combustion, radio-isotope radiation or industrial waste heat.

The present invention affords the opportunity for fabrication of micro engines which can be utilized to efficiently convert the solar or other thermal energy to electrical energy or mechanical energy. Because currently available photocells convert solar radiation energy directly to electrical energy by an opto-electronic process called the photovoltaic effect, they suffer several disadvantages in comparison with the present invention. First, the efficiency of the thermomechanical conversion of energy by Stirling engines is superior to the opto-electronic conversion efficiency of photovoltaic solar cells. In addition, more solar energy is available for conversion by a Stirling engine than by a photocell: while only approximately 25% of the energy in the solar spectrum is within the band of wavelengths that excites a photovoltaic effect, the energy of the entire solar spectrum can be converted to heat for driving the Stirling cycle. Furthermore, with photocells, the amount of energy available for conversion can not be increased by concentrating solar radiation, because that would raise the temperature of the photocell far beyond the very modest temperature at which the necessary electronic properties of semiconductors are lost. In contrast, solar radiation can be concentrated onto the silicon heat acceptor of a Stirling microengine, because it employs the thermo-mechanical and not the electronic properties of silicon.

[Fabrication Methods]

Embodiments of the present invention are preferably fabricated by adapting current planar integrated circuit fabrication processes to the production of these embodiments. These processes include microlithography, various oxidation, deposition, doping, etching and other techniques employed in the integrated circuit and silicon sensor and actuator industries. The electrical, integrated circuit chip, which is to be cooled to subambient temperatures, can be manufactured as a part of the same wafer as a cryocooler embodying the present invention. The silicon surface of the cryocooler can be the substrate within or upon which the electronic circuit is constructed.

The structures of the present invention lend themselves well also to the fabrication of large numbers of multiple replications upon a single wafer and subsequent separation of the wafer into either individual embodiments or groups of multiple embodiments. For example, embodiments may be constructed by forming a cooperating diaphragm, back space, expansion space and heat exchanger for each of a plurality of spaced apart, heat accepting, fluid expansion ends of a plurality of Stirling transducer pressure vessels. This can be done by etching away selected portions of silicon wafers and then aligning and joining the wafers together in-the-plane as an integral expansion end plate. Similarly, a cooperating diaphragm, back space, compression space and heat exchanger, with each of a plurality of spaced apart, heat ejecting, fluid compression ends of a plurality of Stirling transducer pressure vessels may also be formed by etching away selected portions of silicon wafers and then aligning and joining the wafers together in-the-plane as an integral compression end plate.

A plurality of heat regenerators may be formed and joined together as an integral regenerator plate, each regenerator having fluid openings on opposite sides of the regenerator plate. The openings are spaced apart for registration with the end plates. The regenerator plate is then interposed between, aligned with and bonded to the expansion end plate and the compression end plate, by a technique, such as Mallory bonding described in U.S. Pat. No. 3,397,278, to form a unitary structure comprising a plurality of Stirling cycle thermomechanical transducers. This unitary structure may then be separated into individual transducers or separated into a plurality of arrays of multiple transducers.

One manner for forming the integral regenerator plate is to form a plurality of individual, substantially identical regenerators and then bond the regenerators into holes in one or more of the previously mentioned support plates, the holes being arranged in a parallel, laterally spaced array registered with the end plates. The array of individual regenerators is then mechanically connected together to form the regenerator plate. The regenerator plate is then joined between the two end plates.

[Conclusion]

From the above it is apparent that in embodiments of the present invention the entropy generating processes in oscillatory flow are greatly reduced which allows the embodiment to operate at much higher frequencies than previously thought possible for Stirling machines and thus allowing a tiny machine to have a practical thermal pumping capacity and a very desirable specific capacity. While prior art Stirling cycle machines have probably operated at the conventional lower frequencies with a Wolmersley number below 5, the significance of the relationship between the passage size and the Wolmersley number and between displacement amplitude and Mach number have never been associated with an opportunity to build small, high frequency machines.

The broad concept of the invention is the combination of passages exhibiting a characteristic Wolmersley number below 5 and Mach numbers below 0.1 combined with a frequency of operation above 500 Hz.

Because of the dramatic increase in the thermal conductivity of silicon as temperatures decline, silicon makes an exceptionally desirable material for low temperature heat exchangers and heat conducting components. At the same time, silicon is an ideal substrate material for the attachment or fabrication of silicon chips since there is no difference in thermal coefficient of expansion between the substrate and the chip, which, if there were, would otherwise tend to cause detachment or separation under extreme temperature excursions that occur in a cryocooler. Since silicon is the most common material in which electronic circuits are fabricated, silicon offers the possibility of fabricating circuits into the structure of the microrefrigerator's heat exchanger itself. The circuits fabricated into the cooled end heat exchanger might be the circuits that the machine is designed to cool, or they might be circuits that control the operation of the machine.

The small size and high frequency of this machine allows the machine to operate in near-isothermal conditions, unlike the less energy efficient adiabatic conditions in previous, larger, higher frequency machines.

While certain preferred embodiments of the present invention have been disclosed in detail, it is to be understood that various modifications may be adopted without departing from the spirit of the invention or scope of the following claims.

We claim:

1. An improved Stirling cycle thermomechanical transducer having
   (A) a pressure vessel defining an enclosed work space including fluid passages and containing a working fluid which is compressible and expansible fluid, the pressure vessel comprising:
      (a) a heat-accepting, fluid-expansion end having
         (i) an expansion space;
         (ii) a back space distal to the expansion space;
         (iii) a flexible expansion diaphragm forming a wall between the expansion space and the back space; and
         (iv) a heat-accepting heat exchanger proximally bounding the expansion space; and
      (b) a heat-ejecting, fluid-compression end having
         (i) a compression space;
         (ii) a back space distal to the compression
         (iii) a flexible, compression diaphragm forming a wall between the compression space and the back space; and
         (iv) a heat-ejecting heat exchanger proximally bounding the compression space; and
      (c) a heat regenerator interposed between said ends and including a perforate matrix in fluid communication with the expansion space and the compression space; and
   (B) a control circuit apparatus linked to the diaphragms for controlling the mode, amplitude, phase and frequency of the deflections of the diaphragms which alternately strain to provide periodic variations of the expansion space and compression space volumes and for maintaining a nominal 90° phase lead of the expansion space volume ahead of the compression space volume;
   wherein the improvement comprises the combination of: the control circuit apparatus being adapted to operate the transducer above 500 Hz; and the passages in the work space being sufficiently narrow to provide a Wolmersley number, which is characteristic of irreversibilities generated by the oscillating flow of the working fluid in the work space, below substantially 5 and the amplitude of diaphragm vibrations are sufficiently small to provide the working fluid a maximum Mach number below substantially 0.1 at an operating frequency above 500 Hz.

2. A transducer in accordance with claim 1 wherein at least one of said ends of the pressure vessel is an integral plate comprising a high thermal conductivity material.

3. A transducer in accordance with claim 2 wherein the expansion end of the pressure vessel is an integral plate comprising a high thermal conductivity material and the compression end of the pressure vessel is a spaced, parallel integral plate comprising a high thermal conductivity material.

4. A transducer in accordance with claim 3 further including a plurality of said pressure vessels arranged in a parallel two dimensional array, their expansion ends being integrally formed as one plate and their compression ends formed as another plate.

5. A transducer in accordance with claim 2 wherein said high thermal conductivity material is a silicon plate.

6. A transducer in accordance with claim 5 wherein the silicon plate comprises a plurality of laminated, etched silicon wafers joined together in-the-plane.

7. A transducer in accordance with claim 6 wherein said wafers are joined by silicon fusion bonding.

8. A transducer in accordance with claim 6 wherein said wafers are joined by an intermediary film of glass.

9. A transducer in accordance with claim 6 wherein said wafers are joined by an intermediary metal film.

10. A transducer in accordance with claim 6 wherein at least one of said heat exchangers comprises a region of at least one of said silicon wafers, said region being formed with transverse perforations.

11. A transducer in accordance with claim 3 wherein the integral end plates and the regenerator are joined together into an integral structure.

12. A transducer in accordance with claim 11 wherein the end plates are joined to the regenerator by an intermediary metal film.

13. A transducer in accordance with claim 11 wherein the end plates are joined to the regenerator by an intermediary glass film.

14. A transducer in accordance with claim 11 wherein the end plates are joined to the regenerator by an anodic bond.

15. A transducer in accordance with claim 2 or 3 or 4 wherein the interposed regenerator comprises a low thermal conductivity material.

16. A transducer in accordance with claim 15 wherein the low thermal conductivity material of the regenerator comprises a ceramic.

17. A transducer in accordance with claim 15 wherein the low thermal conductivity material of the regenerator comprises a glass.

18. A transducer in accordance with claim 15 wherein the perforate matrix of the regenerator is comprised of a reticulated foam with continuously connected voids along the entire length of the working fluid flow through the regenerator.

19. A transducer in accordance with claim 15 wherein the perforate matrix of the regenerator comprises a plurality of parallel, spaced, planar walls.

20. A transducer in accordance with claim 15 wherein the perforate matrix of the regenerator comprises a plurality of spaced, concentric tubes.

21. A transducer in accordance with claim 15 wherein the regenerator comprises a spirally wound, low thermal conductivity, solid film having projections formed in the film to space its layers.

22. A transducer in accordance with claim 15 wherein the perforate matrix of the regenerator comprises a plurality of parallel tubes.

23. A transducer in accordance with claim 15 wherein the perforate matrix of the regenerator comprises a plurality of spaced, parallel walls defining passages between the walls having a cross-sectional aspect ratio greater than approximately 8.

24. A transducer in accordance with claim 2 or 3 or 4 wherein said diaphragms are flat sheets.

25. A transducer in accordance with claim 2 or 3 or 4 wherein said diaphragms have annular corrugations.

26. A transducer in accordance with claim 2 or 3 or 4 wherein said diaphragms have at least one thickened region forming a boss of additional mass.

27. A transducer in accordance with claim 1 or 2 or 3 or 4 wherein the control circuit apparatus includes a pair of electromechanical actuators, a different one of which is mechanically connected to each of the diaphragms.

28. A transducer in accordance with claim 27 wherein at least one of the electromechanical actuators includes a thin film of piezoelectric material mounted on the diaphragm for applying a mechanical stress to the diaphragm when the piezoelectric material is driven by an electrical signal.

29. A transducer in accordance with claim 27 wherein at least one of the electromechanical transducers comprises a pair of electrically conducting thin film electrodes, one of said electrodes being attached to a diaphragm and the other electrode being spaced from the first electrode and attached to the pressure vessel end for applying a mechanical stress to the diaphragm in response to an electrostatic force between the electrodes when the electrodes are driven by an electrical signal.

30. A transducer in accordance with claim 27 wherein at least one of the electromechanical transducers comprises a pair of electrically conducting thin film coils, one of the coils being attached to a diaphragm and the other coil being attached to the pressure vessel end for applying a mechanical stress to the diaphragm in response to an electromagnetic force between the coils when the coils are driven by an electrical signal.

31. A transducer in accordance with claim 3 wherein the control means includes a pair of electromechanical actuators, a different one of which is mechanically connected to each of the diaphragms and wherein electrical conductors are connected to the diaphragm actuators through the plate.

32. A transducer in accordance with claim 2 or 3 or 4 wherein at least one diaphragm is resonant at substantially the operating frequency of the thermomechanical transducer.

33. A transducer in accordance with claim 32 wherein the back space adjacent a resonant diaphragm forms a gas spring having a characteristic spring constant and acting upon the diaphragm and wherein the diaphragm mass and the spring constant are selected to resonate the diaphragm at substantially the operating frequency of the thermomechanical transducer.

34. A transducer in accordance with claim 32 wherein the back space adjacent a resonant diaphragm is sufficiently large to have a spring constant of substantially zero and wherein the resonant diaphragm mass is selected to resonate with the spring constant of the silicon diaphragm itself at substantially the operating frequency of the thermomechanical transducer.

35. A transducer in accordance with claim 32 wherein the back space forms a gas spring having a characteristic spring constant and wherein a resonant diaphragm has a characteristic second spring constant and wherein the diaphragm mass, the diaphragm spring constant and the gas spring constant are selected to resonate the diaphragm at substantially the operating frequency of the thermomechanical transducer.

36. A transducer in accordance with claims 2 or 3 or 4 wherein the expansion end is formed as a plate and wherein the control circuit apparatus includes a motive power means for driving at least one of the diaphragms for operating the transducer as a refrigerator for lowering the temperature of the expansion end plate.

37. A transducer in accordance with claim 36 wherein an electronic device is thermally linked to the expansion end plate so that a low temperature is produced in the electronic device.

38. A transducer in accordance with claim 36 wherein an electronic device is integrally fabricated in the expansion end plate so that a low temperature is produced in the electronic device.

39. A transducer in accordance with claim 36 wherein electronic devices are fabricated in films attached and thermally linked to the expansion end plate so that a low temperature is produced in the electronic devices.

40. A transducer in accordance with claim 36 wherein the interior of a compartment is thermally linked to the expansion end plate for containing and cooling an object.

41. A transducer in accordance with claim 2 or 3 or 4 wherein a thermal energy source is thermally linked to the expansion end and the control means includes an energy conveying link from the compression diaphragm to a load for operating the transducer as an engine to drive the load.

42. A transducer in accordance with claim 41 wherein said load is an electrical generator.

43. A transducer in accordance with claim 41 wherein said load is a fluid pump.

44. A transducer in accordance with claim 41 wherein a transparent sheet forming a window is mounted to the expansion end in juxtaposition to the expansion diaphragm for admitting solar radiation onto the expansion diaphragm.

45. A transducer in accordance with claim 44 wherein said transparent sheet is contoured as a lense to focus concentrated light upon the diaphragm.

46. A method for constructing a Stirling cycle thermomechanical transducer comprising:

(a) forming a cooperating diaphragm, back space, expansion space and heat exchanger for each of a plurality of spaced apart, heat-accepting, fluid-expansion ends of a plurality of Stirling transducer pressure vessels by etching away selected portions of silicon wafers and then aligning and joining the wafers together in the plane as an integral, expansion end plate;

(b) forming a cooperating diaphragm, back space, compression space and heat exchanger for each of a plurality of spaced apart, heat ejecting, fluid compression ends of a plurality of Stirling transducer pressure vessels by etching away selected portions of silicon wafers and then aligning and joining the wafers together in the plane as an integral compression end plate;

(c) forming a plurality of heat regenerators joined together as an integral regenerator plate, each regenerator having fluid openings on opposite sides of the regenerator plate, the openings being spaced apart for registration with said end plates; and (d) interposing, aligning and joining the regenerator plate between the expansion end plate and the compression end plate to form a unitary structure comprising a plurality of Stirling transducers.

47. A method in accordance with claim 46 further comprising separating the unitary structure between selected transducers to form arrays of transducers.

48. A method in accordance with claim 47 further comprising separating the unitary structure between transducers to form a plurality of individual transducers.

49. A method in accordance with claim 46 wherein the integral regenerator plate is formed by:

(a) forming a plurality of individual, substantially identical regenerators;

(b) aligning the individual regenerators in a parallel, laterally spaced array for registration with said end plates; and (c) mechanically connecting the individual regenerators together to form said regenerator plate.

50. An improved Stirling cycle thermomechanical transducer having:

(A) a pressure vessel defining an enclosed work space including fluid passages and containing a compressible and expansible fluid, the pressure vessel comprising:
 (a) a heat-accepting, fluid expansion region having
  (i) an expansion region
  (ii) a flexible expansion diaphragm forming a wall of the expansion space; and
  (iii) a heat-accepting, heat exchanger bounding the expansion space; and
 (b) a heat-ejecting, fluid compression region having:
  (i) a compression space;
  (ii) a flexible compression diaphragm forming a wall of the compression space; and
  (iii) a heat-ejecting, heat exchanger bounding the compression space; and
 (c) a heat regenerator interposed between said regions and including a perforate matrix in fluid communication with the expansion space and the compression space; and (B) a control circuit apparatus linked to the diaphragms for controlling the mode, amplitude, phase and frequency of the deflections of the diaphragms which alternately strain to provide periodic variations of the expansion space and compression space volumes and for maintaining a nominal 90° phase lead of the expansion space volume ahead of the compression space volume; wherein the improvement comprises the combination of: the control circuit apparatus being adapted to operate the transducer above 500 Hz; and the passages in the work space being sufficiently narrow to provide a Wolmersley number, which is characteristic of the irreversibilities generated by the oscillating flow of the working fluid in the work space, being below substantially 5 and the amplitude of diaphragm vibrations are sufficiently small to provide the working fluid a maximum Mach number below substantially 0.1 at an operating frequency above 500 Hz.

* * * * *

UNITED STATES PATENT AND TRADEMARK OFFICE
CERTIFICATE OF CORRECTION

PATENT NO. : 5,457,956
DATED : Oct. 17, 1995
INVENTOR(S) : Bowman et al.

It is certified that error appears in the above-indentified patent and that said Letters Patent is hereby corrected as shown below:

Column 6, line 41, the formula should appear as follows:

$$X_g = X_d \cdot A_d / A_x \qquad III.$$

Column 6, line 61, the formula should appear as follows:

$$Ma = (2\pi f \cdot x_d \cdot A_x / A_d) / (\gamma RT)^{1/2} \qquad V.$$

Column 9, line 67, delete "layer" and insert --layers-- (2nd occurrence)
   Column 15, line 52, delete "fluid". Column 16, line 44, "in-the-plane" should read --in the plane--.

Signed and Sealed this

Fifth Day of March, 1996

Attest:

BRUCE LEHMAN

Attesting Officer     Commissioner of Patents and Trademarks